United States Patent
Yamanishi et al.

(10) Patent No.: US 7,333,923 B1
(45) Date of Patent: Feb. 19, 2008

(54) DEGREE OF OUTLIER CALCULATION DEVICE, AND PROBABILITY DENSITY ESTIMATION DEVICE AND FORGETFUL HISTOGRAM CALCULATION DEVICE FOR USE THEREIN

(75) Inventors: Kenji Yamanishi, Tokyo (JP); Jun-ichi Takeuchi, Tokyo (JP)

(73) Assignee: NEC Corporation, Tokyo (JP)

( * ) Notice: Subject to any disclaimer, the term of this patent is extended or adjusted under 35 U.S.C. 154(b) by 675 days.

(21) Appl. No.: 09/675,637

(22) Filed: Sep. 29, 2000

(30) Foreign Application Priority Data

Sep. 29, 1999 (JP) ................... 11/275437

(51) Int. Cl.
*G06F 7/60* (2006.01)
*G06F 17/30* (2006.01)
*G06F 15/18* (2006.01)

(52) U.S. Cl. .................. 703/2; 702/179; 702/181; 705/7; 706/14; 707/6

(58) Field of Classification Search ............ 702/181, 702/179, 176; 706/14; 703/2; 705/10, 7; 707/6
See application file for complete search history.

(56) References Cited

U.S. PATENT DOCUMENTS

| | | | | |
|---|---|---|---|---|
| 5,813,002 | A * | 9/1998 | Agrawal et al. | 707/5 |
| 5,832,182 | A * | 11/1998 | Zhang et al. | 706/50 |
| 6,003,029 | A * | 12/1999 | Agrawal et al. | 707/7 |
| 6,055,491 | A * | 4/2000 | Biliris et al. | 702/176 |
| 6,466,894 | B2 * | 10/2002 | Takeuchi et al. | 702/181 |
| 6,904,409 | B1 * | 6/2005 | Lambert et al. | 705/10 |
| 2002/0111769 | A1 * | 8/2002 | Takeuchi et al. | 702/181 |
| 2003/0004902 | A1 * | 1/2003 | Yamanishi et al. | 706/1 |
| 2003/0055600 | A1 * | 3/2003 | Takeuchi | 702/181 |
| 2004/0015458 | A1 * | 1/2004 | Takeuchi et al. | 706/14 |
| 2004/0167893 | A1 * | 8/2004 | Matsunaga et al. | 707/6 |

(Continued)

FOREIGN PATENT DOCUMENTS

JP 6-325009 11/1994

OTHER PUBLICATIONS

Yamanishi, K. et al. "On-line Unsupervised Outlier Detection Using Finite Mixtures With Discounting Lerning Algorithms". Proc. of the 6th ACM SIGKDD. pp. 320-324. 2000.*

(Continued)

*Primary Examiner*—Paul Rodriguez
*Assistant Examiner*—Ayal Sharon
(74) *Attorney, Agent, or Firm*—Scully, Scott, Murphy & Presser, P.C.

(57) ABSTRACT

Degree of outlier of one input data is calculated by an amount of change in a learned probability density from that before learning as a result of taking in of the input data. This is because data largely differing in a tendency from a so far learned probability density function can be considered to have a high degree of outlier. More specifically, a function of a distance between probability densities before and after data input is calculated as a degree of outlier. Accordingly, a probability density estimation device appropriately estimates a probability distribution of generation of unfair data while sequentially reading a large volume of data and a score calculation device calculates and outputs a degree of outlier of each data based on the estimated probability distribution.

12 Claims, 10 Drawing Sheets

PROBABILITY DENSITY ESTIMATION DEVICE
(NORMAL MIXED DISTRIBUTION)

U.S. PATENT DOCUMENTS

2005/0222806 A1* 10/2005 Golobrodsky ............... 702/179

OTHER PUBLICATIONS

Fawcett, T. et al. "Activity Monitoring: Noticing Interesting Changes in Behavior". Proc. 5th ACM SIGKDD. pp. 53-62. 1999.*

Bonchi, F. et al. "A Classification-Based Methodology for Planning Audit Strategies in Fraud Detection". Proc. 5th ACM SIGKDD. pp. 175-184. 1999.*

Lane, L. et al. "Temporal Sequence Learning and Data Reduction for Anomaly Detection". ACM TISSEC. pp. 295-331. 1999.*

Lee, Wenke et al. "Mining in a Data-Flow Environment: Experience in NEtwork Intrusion Detection". Proc. 5th ACM SIGKDD. pp. 114-124. 1999.*

Rosset, S. et al. "Discovery of Fraud Rules for Telecommunications—CHallenges and Solutions". Proc. 5th ACM SIGKDD. pp. 409-413. 1999.*

Kou, Yufeng et al. "Survey of Fraud Detection Techniques." 2004 IEEE Int'l Conf. on Networking, Sensing and Control. 2004. vol. 2, pp. 749-754.*

Lu, Chang-Tien et al. "Exploiting Efficient Data Mining Techniques to Enhance Intrusion Detection Systems." 2005 IEEE Int'l Conf. on Information Reuse and Integration. Aug. 15-17, 2005. pp. 512-517.*

"Outlier Detection: nagdmc_bacon." http://www.nag-j.co.jp/pdf/nagdmc_bacon.pdf. Printed Oct. 6, 2005.*

Cox, K. et al. "Visual Data Mining: Recognizing Telephone Calling Fraud." Data Mining and Knowledge Discovery, vol. 1, pp. 225-231 (1997).*

Publication "Combining Data Mining and Machine Learning for Effective Fraud Detection", Proceedings of AI Approaches to Fraud Detection and Risk Management, by Tom Fawcell and Foster Provost, pp. 14-19, 1997.

"Intrusion Detection with Neural Networks", by J. Ryan, M. Lin and R. Miikkulainen, Proceedings of AI Approaches to Fraud Detection and Risk Management, pp. 72-77, 1997.

"Detecting Celllular Fraud Using Adaptive Prototypes", by P. Burge and J. Shawe-Taylor, Proceedings of AI Approaches to Fraud Detection and Risk Management, pp. 9-13, 1997.

"Maximum Likelihood fromIncomplete Data via the EM Algorithm", by A.P. Dempster, N.M. Laird and D.B. Ribin, Journal of the Royal Statistical Society, B. 39(1), pp. 1-38, 1977.

Yukio Kobayashi, et. al., "An Influence due to Mixel in Category Classification Using EM Algorithm and Its Improvement", vol. 37, No. 1, pp. 39-48, (Jan. 1996).

Ikuo Yonemoto, et. al., "An On-line Estimation Algorithm of Probability Density Function Using Information Criterion", *The Institute of Electronics, Information and Communication Engineers*, Technical Report of IEICE, PRMU98-174 (Dec. 1998), pp. 189-194.

Hang Li, et. al., "Document Classification Using a Finite Mixture Model", pp. 37-44, (1997).

"Self-Organization of Neurons Described by the Maximum-Entropy Principle" by I. Grabec, from biological Cybernetics, vol. 63, pp. 403-409, 1990.

* cited by examiner

PROBABILITY DENSITY ESTIMATION DEVICE
(NORMAL MIXED DISTRIBUTION)

DEGREE OF OUTLIER CALCULATION DEVICE

PROBABILITY DENSITY ESTIMATION DEVICE
(KERNEL MIXED DISTRIBUTION)

DEGREE OF OUTLIER CALCULATION DEVICE

HISTOGRAM CALCULATION DEVICE

DEGREE OF OUTLIER CALCULATION DEVICE

DEGREE OF OUTLIER CALCULATION DEVICE

DEGREE OF OUTLIER CALCULATION DEVICE

DEGREE OF OUTLIER CALCULATION DEVICE, AND PROBABILITY DENSITY ESTIMATION DEVICE AND FORGETFUL HISTOGRAM CALCULATION DEVICE FOR USE THEREIN

BACKGROUND OF THE INVENTION

1. Field of the Invention

The present invention relates to a degree of outlier calculation device, and a probability density estimation device and a histogram calculation device for use therein and, more particularly, to statistical outlier detection, fraud detection and fraud detection techniques for detecting an abnormal value or an outlier which largely deviates from data patterns obtained so far from multi-dimensional time series data.

2. Description of the Related Art

Such a degree of outlier calculation device is for use in finding an abnormal value or an outlier which largely deviates from data patterns obtained so far from multi-dimensional time series data and is employed, for example, in a case of finding such fraud behavior as so-called cloning use from a record of cellular phone services and in a case of finding abnormal transaction from a use history of a credit card.

Well-known conventional fraud detection methods using a machine learning technique include the method by T. Fawcett and F Provost ("Combining Data Mining and Machine Learning for Effective Fraud Detection, Proceedings of AI Approaches to Fraud Detection and Risk Management, pp. 14-19, 1997") and the method by J. Ryan, M. Lin and R. Miikkulainen ("Intrusion Detection with Neural Networks, Proceedings of AI Approaches to Fraud Detection and Risk Management, pp. 72-77, 1997").

Among the above methods, one that makes use of an idea of statistical outlier detection, in particular, is the method by P. Burge and J. Shawe-Taylor ("Detecting Cellular Fraud Using Adaptive Prototypes, Proceedings of AI Approaches to Fraud Detection and Risk Management, pp. 9-13, 1997").

As a learning algorithm for a parametric finite mixture model, well-known is the EM Algorithm by A. P. Dempster, N. M Laird and D. B. Ribin ("Maximum Likelihood from Incomplete Data via the EM Algorithm, Journal of the Royal Statistical Society, B, 39(1), pp. 1-38, 1977").

As a learning algorithm for a normal kernel mixture distribution (a mixture of a finite number of the same normal distributions), the prototype updating algorithm by I. Grabec is known ("Self-Organization of Neurons Described by the Maximum-Entropy Principle, Biological Cybernetics, vol. 63, pp. 403-409, 1990").

The above-described methods by T. Fawcett and F. Provost and by J. Ryan, M. Lin and R. Miikkulainen relate to fraud detection realized by learning unfair detection patterns from data whose fraud is known (so-called supervised data). In practice, however, it is so difficult to obtain sufficient unfair data that highly precise learning can not be conducted to result in a decrease in fraud detection precision.

The method by P. Burge and J. Shawe-Taylor relates to similar fraud detection based on unsupervised data. This method, however, conducts fraud detection with two non-parametric models, a short-term model and a long-term model, to make a distance between them as a criterion for an outlier. Statistical basis of the short-term model and the long-term model is insufficient to make statistical significance of a distance therebetween unclear.

In addition, preparation of two models, short-term and long-term models, deteriorates calculation efficiency. Further problems are involved such as a problem that only continuous value data can be handled and not categorical data and a problem that since only non-parametric models are handled, fraud detection is unstable and inefficient.

Although as a learning algorithm for a statistical model, the EM algorithm by A. P. Dempster, N. M. Laird and D. B. Ribin and the prototype updating algorithm by I. Grabec are known, since these algorithms learn from all the past data equally weighted, they fail to cope with a pattern change.

SUMMARY OF THE INVENTION

An object of the present invention is to provide a degree of outlier calculation device capable of automatically detecting fraud based on data whose fraud is yet to be known (unsupervised data), and a probability density estimation device and a histogram calculation device for use therein.

Another object of the present invention is to provide a degree of outlier calculation device which adopts an outlier determination criteria whose statistical significance is clear and uses a model including short-term and long-term models combined into one, thereby improving efficiency of calculation, coping with categorical data and enabling stable and efficient outlier detection using not only a non-parametric model but also a parametric model, and a probability density estimation device and a histogram calculation device for use therein.

A further object of the present invention is to provide a degree of outlier calculation device which realizes in the device an algorithm learning while forgetting past data by weighting less on older data to enable even a change in pattern to be flexibly followed, and a probability density estimation device and a histogram calculation device for use therein.

According to the first aspect of the invention, for use in a degree of outlier calculation device for sequentially calculating a degree of outlier of each data with a data sequence of real vector values as input, a probability density estimation device for, while sequentially reading the data sequence, estimating a probability distribution of the data in question by using a finite mixture of normal distributions (normal mixture for short), comprises probability calculation means for calculating, based on a value of input data and values of a mean parameter and a variance parameter of each of a finite number of normal distribution densities, a probability of generation of the input data in question from each normal distribution, and parameter rewriting means for updating and rewriting the stored parameter values while forgetting past data, according to newly read data based on a probability obtained by the probability calculation means, values of a mean parameter and a variance parameter of each normal distribution and a weighting parameter of each normal distribution.

In the preferred construction, the probability density estimation device further comprises parameter storage means for storing values of a mean parameter and a variance parameter of each of a finite number of normal distribution densities and a weighting parameter of each normal distribution, wherein the parameter rewriting means updates and rewrites data of the parameter storage means.

According to the second aspect of the invention, a degree of outlier calculation device for sequentially detecting a degree of outlier of each data with a data sequence of real vector values as input, comprises a probability density estimation device for, while sequentially reading the data sequence, estimating a probability distribution of generation of the data in question by using a finite mixture of normal distributions including (a) parameter storage means for storing values of a mean parameter and a variance parameter of each of a finite number of normal distribution densities and a weighting parameter of each normal distribution, (b) probability calculation means for calculating, based on a value of input data and values of a mean parameter and a variance parameter of each of a finite number of normal distribution densities, a probability of generation of the input data in question from each normal distribution, and (c) parameter rewriting means for updating and rewriting the stored parameter values while forgetting past data, according to newly read data based on a probability obtained by the probability calculation means, values of a mean parameter and a variance parameter of each normal distribution and a weighting parameter of each normal distribution, and degree of outlier calculation means for calculating and outputting a degree of outlier of the data by using a parameter of the normal mixture updated by the probability density estimation device and based on a probability distribution estimated from values of the parameters before and after the updating and the input data.

According to the third aspect of the invention, a probability density estimation device for use in a degree of outlier calculation device to, while sequentially reading a data sequence, estimate a probability distribution of generation of the data in question by using a finite number of normal kernel distributions, comprises parameter storage means for storing a value of a parameter indicative of a position of each kernel, and parameter rewriting means for reading a value of a parameter from the storage means and updating the stored parameter values while forgetting past data, according to newly read data to rewrite the contents of the parameter storage means.

According to another aspect of the invention, a degree of outlier calculation device for sequentially calculating a degree of outlier of each data with a data sequence of real vector values as input, comprises a probability density estimation device for, while sequentially reading the data sequence, estimating a probability distribution of generation of the data in question by using a finite number of normal kernel distributions including (a) parameter storage means for storing a value of a parameter indicative of a position of each kernel, and (b) parameter rewriting means for reading a value of a parameter from the storage means and updating the stored parameter values while forgetting past data, according to newly read data to rewrite the contents of the parameter storage means, and degree of outlier calculation means for calculating and outputting a degree of outlier of the data by using the parameter updated by the probability density estimation device and based on a probability distribution estimated from values of the parameters before and after the updating and the input data.

According to another aspect of the invention, for use in a degree of outlier calculation device for sequentially calculating a degree of outlier of each data with discrete value data as input, a histogram calculation device for calculating a parameter of a histogram with respect to the discrete value data sequentially input, comprises storage means for storing a parameter value of the histogram, and parameter updating means for reading the parameter value from the storage means and updating past parameter values while forgetting past data based on input data to rewrite the value of the storage means, thereby outputting some of parameter values of the storage means.

According to another aspect of the invention, a degree of outlier calculation device for sequentially calculating a degree of outlier of each data with discrete value data as input, comprises a histogram calculation device for calculating a parameter of a histogram with respect to the discrete value data sequentially input including storage means for storing a parameter value of the histogram, and parameter updating means for reading the parameter value from the storage means and updating past parameter values while forgetting past data based on input data to rewrite the value of the storage means, thereby outputting some of parameter values of the storage means, and score calculation means for calculating, based on the output of the histogram calculation device and the input data, a score of the input data in question with respect to the histogram, thereby outputting the output of the score calculation means as a degree of outlier of the input data.

According to another aspect of the invention, a degree of outlier calculation device for calculating a degree of outlier with respect to sequentially input data which is described both in a discrete value and in a continuous value, comprises a histogram calculation device for estimating a histogram with respect to a discrete value data part, probability density estimation devices provided as many as the number of cells of the histogram for estimating a probability density with respect to a continuous value data part, cell determination means for determining to which cell of the histogram the discrete value data part belongs to send the continuous data part to the corresponding one of the probability density estimation devices, and score calculation means for calculating a score of the input data based on a probability distribution estimated from output values of the histogram calculation device and the probability density estimation device and the input data, thereby outputting the output of the score calculation means as a degree of outlier of the input data, the histogram calculation device including storage means for storing a parameter value of the histogram, and parameter updating means for reading the parameter value from the storage means and updating past parameter values while forgetting past data based on input data to rewrite the value of the storage means, thereby outputting some of parameter values of the storage means, and the probability density estimation device including parameter storage means for storing values of a mean parameter and a variance parameter of each of a finite number of normal distribution densities and a weighting parameter of each normal distribution, probability calculation means for calculating, based on a value of input data, and values of a mean parameter and a variance parameter of each of a finite number of normal distribution densities, a probability of generation of the input data in question from each normal distribution, and parameter rewriting means for updating and rewriting the stored parameter values while forgetting past data, according to newly read data based on a probability obtained by the probability calculation means, values of a mean parameter and a variance parameter of each normal distribution and a weighting parameter of each normal distribution.

According to another aspect of the invention, a degree of outlier calculation device for calculating a degree of outlier with respect to sequentially input data which is described both in a discrete value and in a continuous value, comprises a histogram calculation device for estimating a histogram with respect to the discrete value data part, probability density estimation devices provided as many as the number of cells of the histogram for estimating a probability density with respect to a continuous value data part, cell determination means for determining to which cell of the histogram the discrete value data part belongs to send the continuous data part to the corresponding one of the probability density estimation devices, and score calculation means for calculating a score of the input data based on a probability distribution estimated from output values of the histogram calculation device and the probability density estimation device and the input data, thereby outputting the output of the score calculation means as a degree of outlier of the input data, the histogram calculation device including storage means for storing a parameter value of the histogram, and parameter updating means for reading the parameter value from the storage means and updating past parameter values while forgetting past data based on input data to rewrite the value of the storage means, thereby outputting some of parameter values of the storage means, and the probability density estimation device including parameter storage means for storing a value of a parameter indicative of a position of each kernel, and parameter rewriting means for reading a value of a parameter from the storage means and updating the stored parameter values while forgetting past data, according to newly read data to rewrite the contents of the parameter storage means.

According to another aspect of the invention, for use in a degree of outlier calculation device for sequentially calculating a degree of outlier of each data with a data sequence of real vector values as input, a probability density estimation method of, while sequentially reading the data sequence, estimating a probability distribution of generation of the data in question by using a finite mixture of normal distributions, comprising the steps of based on values of a mean parameter and a variance parameter of each of a finite number of normal distribution densities read from parameter storage means for storing a value of input data, values of a mean parameter and a variance parameter of each of a finite number of normal distribution densities, and a weighting parameter of each normal distribution, calculating a probability of generation of the input data in question from each normal distribution, and updating the stored parameter values while forgetting past data, according to newly read data based on a probability obtained by the probability calculation means, values of a mean parameter and a variance parameter of each normal distribution and a weighting parameter of each normal distribution to rewrite data of the parameter storage means.

According to another aspect of the invention, a degree of outlier calculation method of sequentially calculating a degree of outlier of each data, with a data sequence of real vector values as input, wherein probability density estimation for, while sequentially reading the data sequence, estimating a probability distribution of generation of the data in question by using a finite mixture of normal distributions, comprises the steps of:

based on values of a mean parameter and a variance parameter of each of a finite number of normal distribution densities read from parameter storage means for storing a value of input data, values of a mean parameter and a variance parameter of each of a finite number of normal distribution densities, and a weighting parameter of each normal distribution, calculating a probability of generation of the input data in question from each normal distribution, and updating the stored parameter values while forgetting past data, according to newly read data based on a probability obtained by the probability calculation means, values of a mean parameter and a variance parameter of each normal distribution and a weighting parameter of each normal distribution to rewrite data of the parameter storage means, and which further comprises the step of:

calculating and outputting a degree of outlier of the data by using a parameter of the normal mixture updated by the probability density estimation and based on a probability distribution estimated from values of the parameters before and after the updating and the input data.

According to another aspect of the invention, a probability density estimation method for use in calculation of a degree of outlier to, while sequentially reading a data sequence, estimate a probability distribution of generation of the data in question by using a finite number of normal kernel distributions, comprising the steps of:

storing a value of a parameter indicative of a position of each kernel in parameter storage means, and reading a value of a parameter from the storage means and updating the stored parameter values while forgetting past data, according to newly read data to rewrite the contents of the parameter storage means.

According to another aspect of the invention, a degree of outlier calculation method of sequentially calculating a degree of outlier of each data, with a data sequence of real vector values as input, wherein probability density estimation for, while sequentially reading the data sequence, estimating a probability distribution of generation of the data in question by using a finite number of normal kernel distributions comprises the steps of:

storing a value of a parameter indicative of a position of each kernel in parameter storage means, reading a value of a parameter from the storage means and updating the stored parameter values while forgetting past data, according to newly read data to rewrite the contents of the parameter storage means, and which further comprises:

degree of outlier calculation means for calculating and outputting a degree of outlier of the data by using the parameter updated by the probability density estimation and based on a probability distribution estimated from values of the parameters before and after the updating and the input data.

According to another aspect of the invention, for use in calculation of a degree of outlier for sequentially calculating a degree of outlier of each data with discrete value data as input, a histogram calculation method of calculating a parameter of a histogram with respect to the discrete value data sequentially input, comprising the steps of:

reading the parameter value from storage means for storing a parameter value of the histogram and updating past parameter values while forgetting past data based on input data to rewrite the value of the storage means, and outputting some of parameter values of the storage means.

According to a further aspect of the invention, a degree of outlier calculation device for sequentially calculating a degree of outlier of each data with discrete value data as input, comprising:

a histogram calculation device for calculating a parameter of a histogram with respect to the discrete value data sequentially input including storage means for storing a parameter value of the histogram, and parameter updating means for reading the parameter value from the storage means and updating past parameter values while forgetting past data based on input data to rewrite the value of the storage means, thereby outputting some of parameter values of the storage means, and score calculation means for calculating, based on the output of the histogram calculation device and the input data, a score of the input data in question with respect to the histogram, thereby outputting the score calculation result as a degree of outlier of the input data.

According to a still further aspect of the invention, a degree of outlier calculation method of calculating a degree of outlier with respect to sequentially input data which is described both in a discrete value and in a continuous value, wherein histogram calculation which estimates a histogram with respect to a discrete value data part comprises the steps of:

reading the parameter value from storage means for storing a parameter value of the histogram and updating past parameter values while forgetting past data based on input data to rewrite the value of the storage means, and outputting some of parameter values of the storage means, and wherein in probability density estimation devices provided as many as the number of cells of the histogram for estimating a probability density with respect to a continuous value data part, the method comprises the steps of:

based on values of a mean parameter and a variance parameter of each of a finite number of normal distribution densities read from parameter storage means for storing a value of input data, values of a mean parameter and variance parameter of each of a finite number of normal distribution densities and a weighting parameter of each normal distribution, calculating a probability of generation of the input data in question from each normal distribution, and based on a probability obtained by the probability calculation means, values of a mean parameter and a variance parameter of each normal distribution and a weighting parameter of each normal distribution, updating the stored parameter values while forgetting past data, according to newly read data to rewrite the data of the parameter storage means, and wherein the method further comprises the steps of:

determining to which cell of the histogram the discrete value data part belongs to send the continuous data part to the corresponding one of the probability density estimation devices, calculating a score of the input data based on a probability distribution estimated from output values of the histogram calculation device and the probability density estimation device and the input data, and outputting the score calculation result as a degree of outlier of the input data.

In the present invention, with one value of time series data as x, assuming that input data is multi-divisional data, the contents of x include, for example, one real number, an attribute of a discrete value of a multi-divisional real number value vector and a multi-divisional vector having the foregoing elements. In a case of cellular phone, x may be expressed as follows which is one example only:

x=(telephone service start time, telephone service duration time and origin of service)

A probability density function of a probability distribution followed by x represents character of a data generation mechanism (e.g. telephone service pattern of user). The degree of outlier calculation device according to the present invention learns a probability density function every time time series data is applied. Under these circumstances, it is assumed that a "degree of outlier" is basically calculated based on the two ideas (A) and (B) shown below.

A) A degree of outlier of one input data is calculated based on the amount of a change in a learned probability density from that before learning caused as a result of taking in the input data. This is on the premise that data largely differing in tendency from a learned probability density function is considered to have a high degree of outlier. More specifically, a function of a distance between probability densities before and after data input is calculated as a degree of outlier.

B) A likelihood of a probability density function so far obtained by learning with respect to input data is calculated (value of the probability density function with respect to the input data). It can be understood that larger the likelihood is, the higher the degree of outlier is. In practice, a value obtained by adding a negative sign to a logarithm of the likelihood (negative logarithmic likelihood) is output as a degree of outlier.

In addition, a combination of the above two functions and the like can be used. As described in the foregoing, the device according to the present invention represents statistical character of a data generation mechanism by a probability density function (the function of a probability density estimation device) and based thereon, calculates and outputs how input data deviates from the character of the data generation mechanism as a "degree of outlier" (the function of the degree of outlier calculation device).

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings.

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

First, description will be made of a probability density estimation device using a normal mixture. Assume that data x (d-dimensional vector value) is generated according to the following Expression 1 as a probability distribution:

$$p(x \mid \theta) = \sum_{i=1}^{k} c_i p\left(x \mid \mu_i, \sum_i\right) \quad (1)$$

In the expression, holds the following:

$$p\left(x \mid \mu_i, \sum_i\right) = \frac{1}{(2\pi)^{\frac{d}{2}} |\sum_i|^{\frac{1}{2}}} \exp\left(-\frac{1}{2}(x-\mu_i)^T \sum_i^{-1} (x-\mu_i)\right)$$

and $\mu_i$ denotes a n-dimensional vector which is a parameter indicative of a mean value of an n-dimensional normal distribution and $\Sigma_i$ denotes an n-dimensional square matrix which is a parameter indicative of a variance of the n-dimensional normal distribution. $c_i$ denotes a parameter indicative of a weight of a normal distribution. Here, k represents an integer indicative of the number of overlaps and holds the following:

$c_i \geq 0$ and $\Sigma_{-1}^{k} c_i \geq 1$

It is also assumed that $\theta = (c_i, \mu_i, \Sigma_i, \ldots, c_k, \mu_k, \Sigma_k)$ represents a parameter vector.

Figure 1:
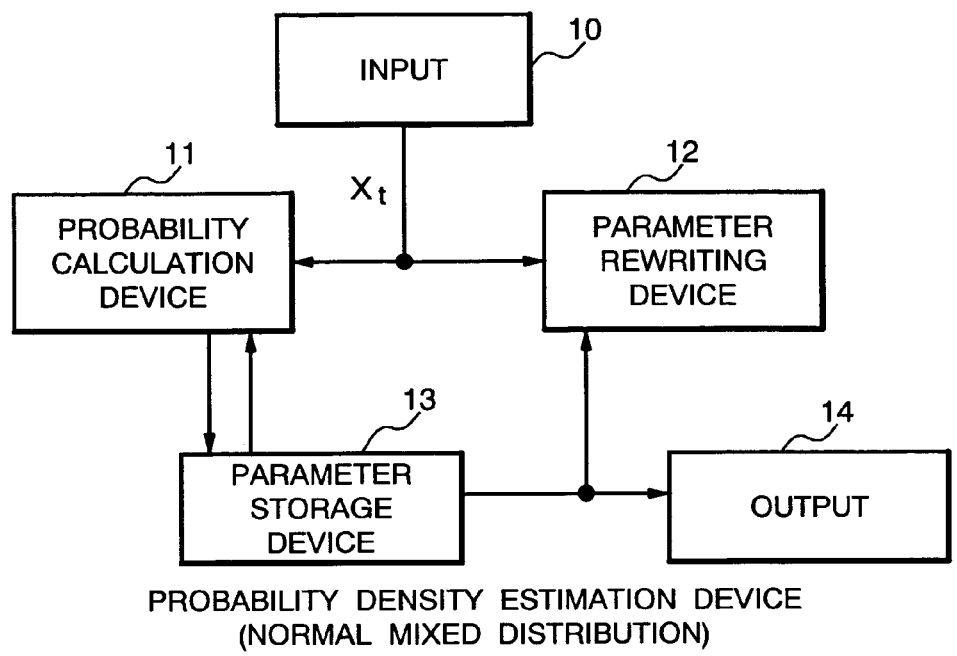
FIG. 1 is a diagram showing a structure of one example of a probability density estimation device (normal mixture) according to the present invention.

FIG. 1 is a block diagram showing a probability density estimation device according to one embodiment of the present embodiment. Assume here that a constant r ($0 \leq r \leq 1$ and the smaller r becomes, the faster past data is forgotten) indicative of a forgetting speed and k as the number of overlaps of normal distributions are given in advance. In addition, the parameter $\alpha$ ($\alpha > 0$) is also used which is assumed to be given in advance.

In FIG. 1, a parameter storage device 13 is a device for storing the above-described parameter $\theta$, a parameter rewriting device 12 is capable of storing a d-dimensional vector $\mu_i'$ and a d-dimensional square matrix $\Sigma_i'$ as well. The reference numeral 10 represents a data input unit, 11 a probability calculation device for calculating a probability and 14 a parameter output unit.

Figure 2:
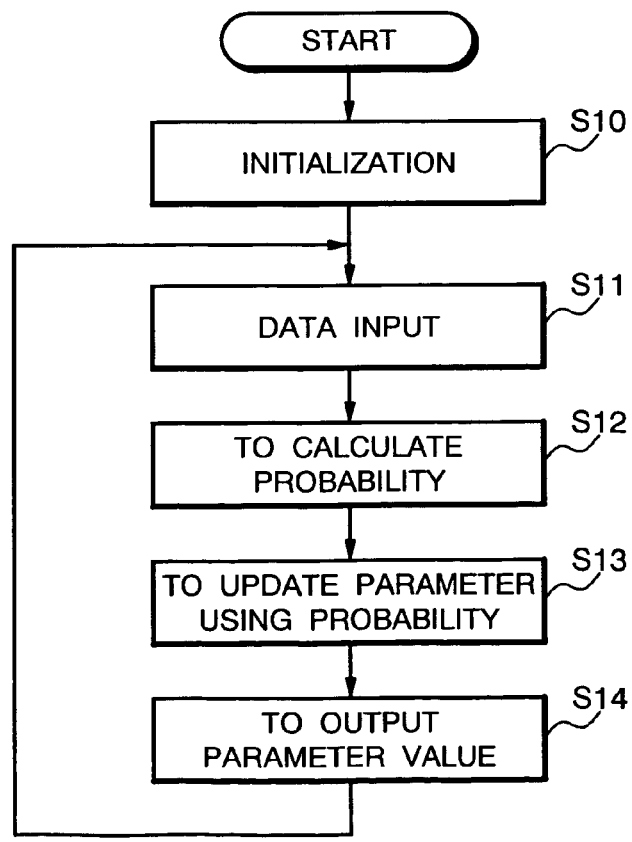
FIG. 2 is a flow chart showing operation of the device illustrated in FIG. 1.

FIG. 2 is a flow chart showing schematic operation of the block illustrated in FIG. 1 and the device of FIG. 1 operates in a manner as described in the following. First, initialize a value of each parameter stored in the parameter storage device 13 before data reading (Step S10). Next, the device operates in the following manner every time t-th data $x_t$ is input. The input $x_t$ is transferred to and stored in the probability calculation device 11 and the parameter rewriting device 12 (Step 11).

The probability calculation device 11 reads a current value $\theta$ of the parameter from the parameter storage device 13, based on the value, calculates each probability $\gamma_i$ (i=1, 2, ..., k) that each normal distribution generates the data $x_t$ according to the following [Expression 4] (Step S12) and sends the calculation result to the parameter rewriting device 12:

$$\gamma_i := (1 - \alpha r) \frac{c_i p\left(x_t \mid \mu_i, \sum_i\right)}{\sum_{i=1}^{k} c_i p\left(x_t \mid \mu_i, \sum_i\right)} + \frac{\alpha r}{k}$$

The parameter rewriting device 12 reads the current parameter value from the parameter storage device 13 while sequentially calculating an updating result of the parameter value with respect to each of i=1, 2, ..., k in a manner as shown in the following expressions (2) to (6) by using the received probability $\gamma_i$ to rewrite the parameter values stored in the parameter storage device 13 (Step S13). In these expressions (2) to (6), the sign ":=" signifies that a right-side term is to substitute for a left-side term.

$$c_i := (1-r)c_i + r\gamma_i \quad (2)$$

$$\mu_i' := (1-r)\mu_i' + r\gamma_i \cdot x_t \quad (3)$$

$$\mu_i := \frac{\mu_i'}{c_i} \quad (4)$$

$$\Sigma_i' := (1-r)\Sigma_i' + r\gamma_i \cdot x_t x_t^T \quad (5)$$

$$\sum_i := \frac{\sum_i'}{c_i} - \mu_i \mu_i^T \quad (6)$$

Then, the parameter storage device 13 outputs the rewritten parameter values (Step S14). The updating rule is equivalent to maximization of a logarithmic likelihood having a weight of $(1-r)^l$ with respect to the (t-l)th data and realizes such estimation as made by forgetting past data one by one. This accordingly results in learning using latest 1/r number of data (l: positive integer).

This is because a solution of $(1-r)^l=1/2$ is expressed as:

$l=-(\log 2)/\log(1-r) \sim (\log 2)/r$

Thus, the probability density expressed by the above Expression (1) and the function is completely designated by a finite number of parameters. Therefore, only the designation of a parameter value is enough for expressing the present probability density function, so that the parameter output unit 14 illustrated in FIG. 1 enables estimation of the probability density function in question. A device for calculating a degree of outlier of input data using thus estimated probability density function is shown in the block diagram of FIG. 3.

Figure 3:
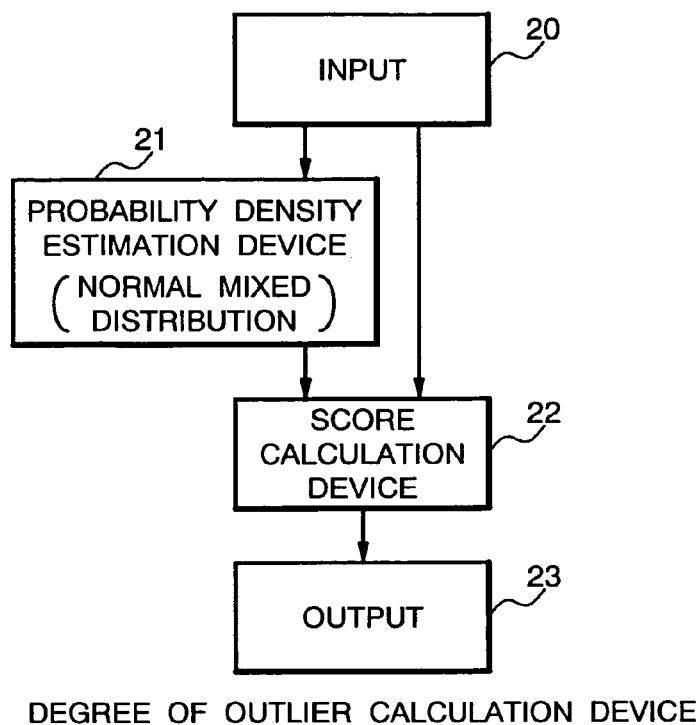
FIG. 3 is a diagram showing a structure of an example of a degree of outlier calculation device using the device of FIG. 1.
Figure 4:
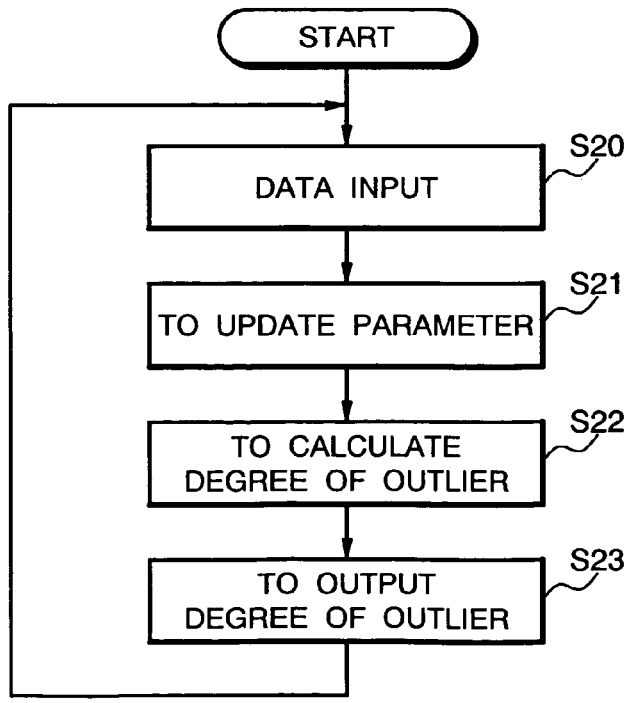
FIG. 4 is a flow chart of operation of the device illustrated in FIG. 3.

FIG. 3 is a block diagram showing one embodiment of a degree of outlier calculation device. The present device includes an input unit 20, a probability density estimation device 21 illustrated in FIG. 1, a score calculation device 22 for calculating a degree of outlier of data, that is, a score, based on a probability distribution estimated from input data and a parameter from the probability density estimation device 21, and an output unit 23 for outputting the calculation result. The device shown in FIG. 3 operates in the following manner according to a flow chart of FIG. 4 every time t-th data $x_t$ is input.

The input $x_t$ is transferred to the probability density estimation device 21 (normal mixture) and the score calculation device 22 (Step S20) and stored therein. The probability density estimation device 21 updates a value of a stored parameter according to the input data (Step S21) and inputs the new value to the score calculation device 22. The score calculation device 22 calculates a score using the input data, the parameter value and the parameter value handed over in the past (Step S22) and outputs the same (Step S23). A score indicative of a degree of outlier is calculated, for example, using a square distance, a Hellinger distance and further a logarithmic loss.

In the following, the calculation will be described more specifically. In a case where with a parameter θ(t) estimated from data $x_t = x_1 x_2 \ldots x_t$, the expression $p^{(t)}(x)=p(x|\theta(t))$ holds and with respect to probability distributions p and q, $d_s$ (p, q) represents a square distance between the two distributions and dh(p,q) represents a Hellinger distance, any of the followings can be used as a score:

$d_s(p^{(t)},p^{(t-1)})=\int (p^{(t)}(x)-p^{(t-1)}(x))^2 dx$ $d_h(p^{(t)},p^{(t-1)}))=\int (\sqrt{p^{(t)}(x)}-\sqrt{p^{(t-1)}(x)})^2 dx$ A logarithmic loss can be calculated by the following expression:

log p(t-1)(xt)

These can be immediately generalized into ds ($p^{(t)}$, $p^{(t-T)}$) etc. with T as a positive integer.

Next, another embodiment of a probability density estimation device according to the present invention will be described. In this example, used as a data generation model is the following expression which is a kernel mixture distribution:

$$p(x|q) = \frac{1}{k}\sum_{i=1}^{k} \omega(x:q_i)$$

In the expression, "ω(•:•) is called a kernel function which is provided in the form of the following normal density function (referred to as normal distribution kernel):

$$\omega(x:\omega_t) = \frac{1}{(2\pi)^{\frac{d}{2}}|\Sigma|^{\frac{1}{2}}} \exp\left(-\frac{1}{2}(x-q_i)^T \Sigma^{-1} (x-q_i)\right)$$

In the expression, Σ represents a diagonal matrix and the following equation holds:

$\Sigma = diag(\sigma^2, \ldots, \sigma^2)$

σ represents an applied positive integer. Each $q_i$ denotes a d-dimensional vector which is a parameter designating a position of each kernel function. $\{q_i\}$ is called prototype. $x_m$ represents an m-th component of x. Similarly, qim represents an m-th component of $q_i$.

Figure 5:
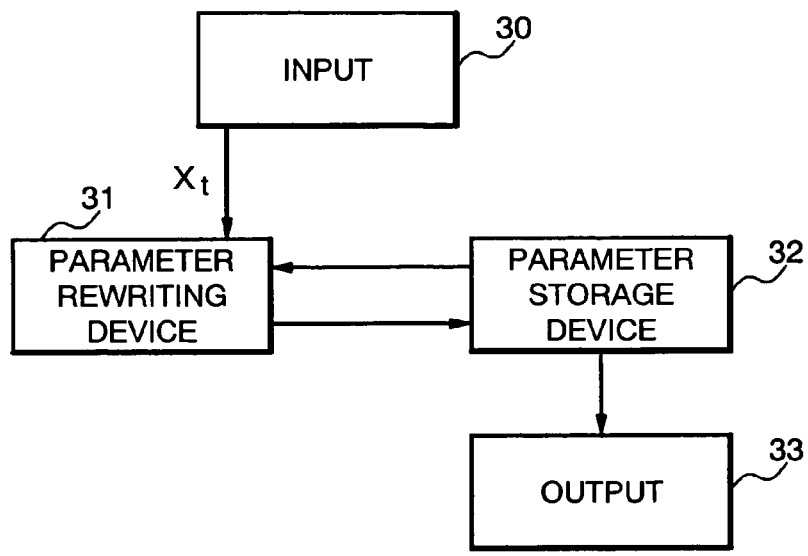
FIG. 5 is a diagram showing a structure of one example of a probability density estimation device (kernel mixture) according to the present invention.
Figure 6:
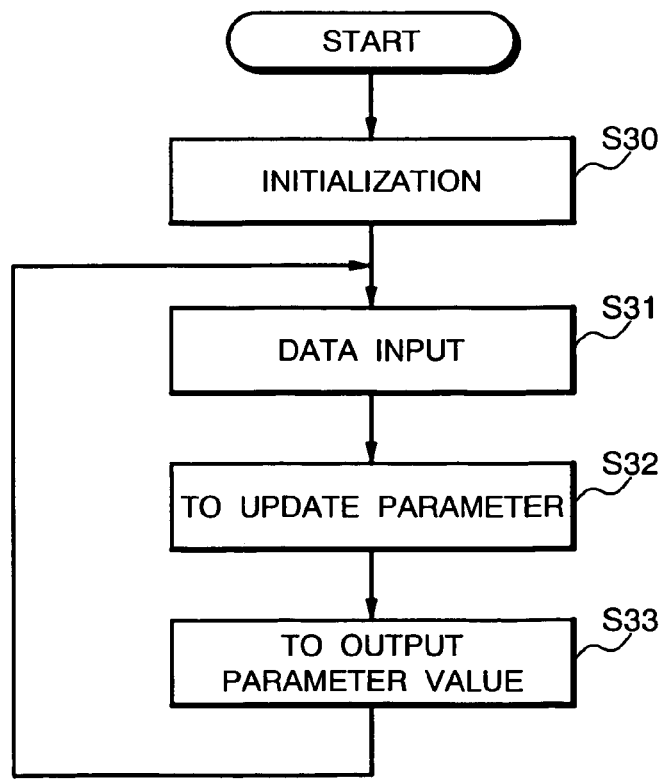
FIG. 6 is a flow chart of operation of the device illustrated in FIG. 5.

FIG. 5 is a block diagram showing a probability density estimation device using a kernel mixture distribution. A parameter storage device 32 has a function of storing q=($q_1$, $q_2$, ..., $q_k$). In FIG. 5, 30 denotes an input unit, 31 a parameter rewriting device and 33 an output unit. The device shown in FIG. 5 operates in the following manner according to a flow chart of FIG. 6. First, prior to data reading, initialize a parameter value stored in the parameter storage device 32 (Step S30). Then, every time t-th data $x_t$ is input, the device operates according to the following procedures. The input $x_t$ is transferred to the parameter rewriting device 31 (Step S31) and stored therein. The parameter rewriting device 31 reads a current parameter value q from the parameter storage device 32 and obtains a solution Δq of the following simultaneous linear equations (k=1, 2, ..., K, l=1, 2, ..., d) (δ ml represents a Kronecker delta, that is, when m=1, it equals 1 and otherwise equals 0) to rewrite, as q:=q+Δq, the parameter value stored in the parameter storage device 32 (Step S32):

$$\sum_{j=1}^{K}\sum_{m=1}^{d} C_{jmkl}\Delta_{qjm} = rB_{kl} \tag{7}$$

however $B_{kl} =$ $$K \cdot (x_t + 1, l - q_{kl})\exp\left(-\frac{|x_{t+1} - q_k|^2}{4\sigma^2}\right) - \sum_{i=1}^{K}(q_{il} - q_{kl})\exp\left(-\frac{|q_i - q_k|^2}{4\sigma^2}\right)$$

$$C_{jmkl} = \left(\delta_{ml} - \frac{(q_{kl} - q_{jl})(q_{km} - q_{jm})}{2\sigma^2}\right)\exp\left(-\frac{|q_k - q_j|^2}{4\sigma^2}\right)$$

The parameter storage device 32 outputs the rewritten parameter value (Step S33).

In the foregoing updating rules, r denotes a parameter which controls a forgetting speed. More specifically, a kernel mixture distribution obtained by sequentially adapting the rules in question minimizes a square distance from a probability density expressed as the following expression:

$$\sum_{\tau=2}^{t} r(1-r)^{t-\tau} w(x:x_\tau) + (1-r)^{t-1} w(x:x_1) \qquad (8)$$

The algorithm by I. Grabec adopted by P. Burge and J. Shawe-Taylor corresponds to the above expression with r as a constant replaced by 1/τ. In this case, an expression corresponding to Expression (8) will be simply expressed as:

$$\sum_{\tau=1}^{t} (1/t) w(x:x_\tau)$$

Figure 7:
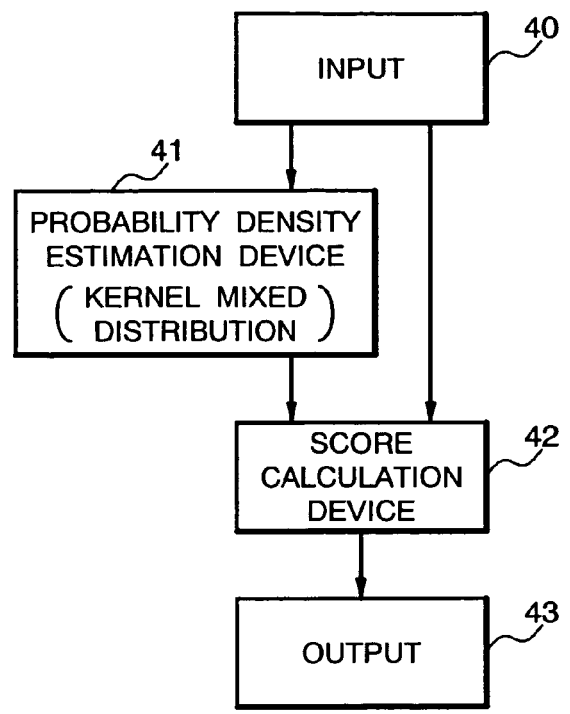
FIG. 7 is a diagram showing a structure of an example of a degree of outlier calculation device using the device of FIG. 6.

An example of a degree of outlier calculation device for calculating a degree of outlier of input data using a parameter obtained from the probability density estimation device employing a kernel mixture distribution shown in FIG. 5 is illustrated in FIG. 7. In FIG. 7, 40 represents an input unit, 41 the probability density estimation device shown in FIG. 5, 42 a score calculation device and 43 an output unit.

Figure 8:
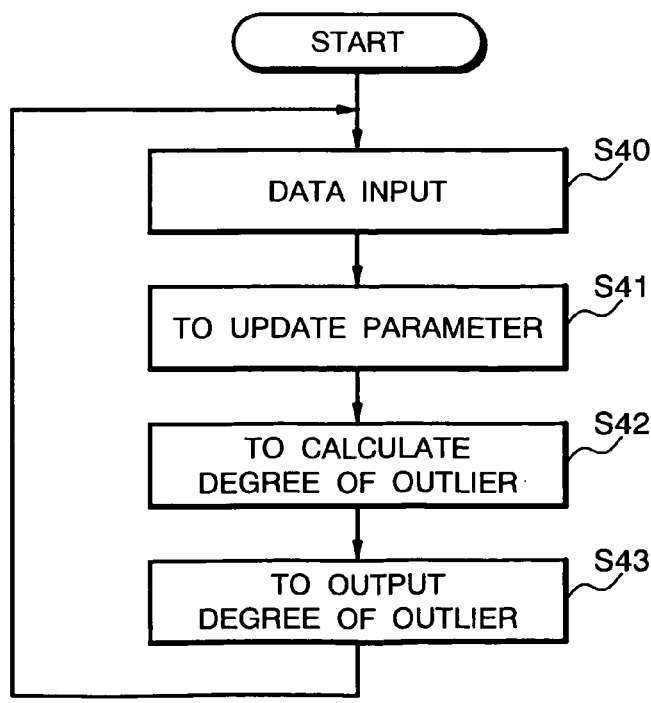
FIG. 8 is a flow chart of operation of the device illustrated in FIG. 7.

The device illustrated in FIG. 7 operates according to the following procedures and a flow chart of FIG. 8 every time t-th data $x_t$ is input. The input $x_t$ is transferred to the probability density estimation device 41 (kernel mixture distribution) and the score calculation device 42 (Step S40) and stored therein. The probability density estimation device 41 updates a value of a stored parameter according to the input data and supplies the new value to the score calculation device 42. The score calculation device 42 calculates a score using the input data, the value of the parameter and values of parameters handed over in the past and outputs the same (Steps S42 and S43). In this case, the same score function as that in the degree of outlier calculation device shown in FIG. 3 can be used.

Figure 9:
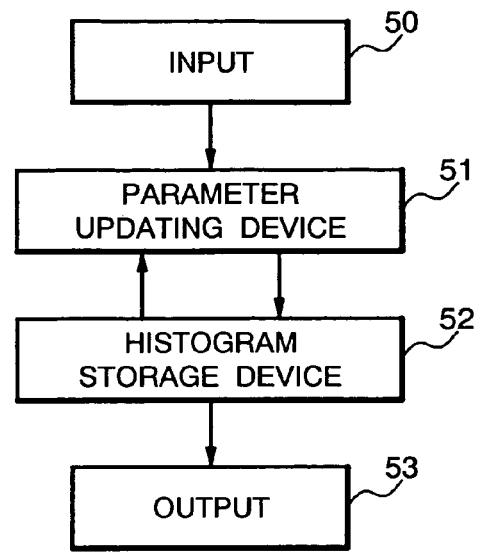
FIG. 9 is a diagram showing a structure of one example of a histogram calculation device according to the present invention.

FIG. 9 is a diagram showing an entire structure of a histogram calculation device according to the present invention. Discrete value data is sequentially input to a parameter updating device 51 to which a histogram storage device 52 is connected which stores a parameter value of a histogram and outputs the same. 50 represents an input unit and 53 represents an output unit.

Figure 10:
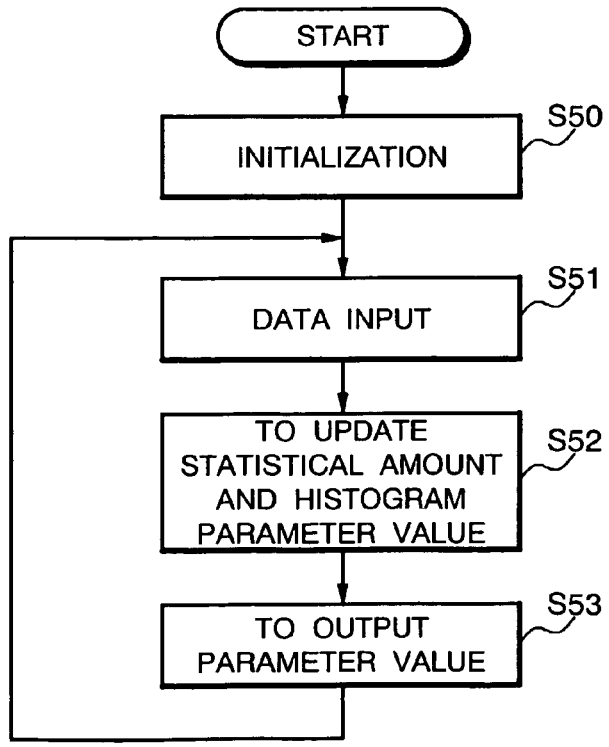
FIG. 10 is a flow chart of operation of the device illustrated in FIG. 9.

FIG. 10 is a flow chart showing operation of the device illustrated in FIG. 9. Assume that discrete value data is designated by a number n of variables. Assume here that an n-dimensional data space is divided into a number N of exclusive cells in advance and that a histogram is formed on these cells. Histogram represents a probability distribution with $(p_1, \ldots p_N)$ as a parameter.

Here, $p_j$ satisfies the following equation.

Here, $p_j$ represents an occurrence probability of a j-th cell. Assume that $T0(j)=0$ $(j=1, \ldots, N)$, $0<r<1$ and $\beta>0$ are given numbers and that initial parameters are as follows (Step S50):

$$p(0)(1) = \ldots = p(0)(N) = 1/N$$

The parameter updating device 51 conducts updating with respect to t-th input data [Step S51] in the following manner (Step S52):

$$T_t(j) = (1-r)T_{t-1}(j) + \delta_t(j)$$

$$p^{(t)}(j) = \frac{T_t(j) + \beta}{(1-(1-r)^m)/r + N\beta}$$

In the expression, $\delta^t(j)$ takes 1 when the t-th data is input to the j-th cell and otherwise takes 0. This updating is conducted with respect to all the cells.

With $p^{(t)}(1), \ldots, p^{(t)}(N)$ as new parameters of the histogram, updating is conducted. These values are sent to the histogram storage device 52. The histogram storage device 52 stores several past parameter values and outputs a part of them (Step S53).

The parameter updating device 51 conducts calculation at each step by multiplying data as of time t before by a weight of $(1-r)^t$. The weighting indicates that the older the data is, the more gradually it is forgotten and realizes in the device an algorithm learning while forgetting. As a result, it is possible to flexibly follow a change of a user pattern.

A histogram represents a probability distribution on a categorical variable and expresses, similarly to a probability density function on a continuous variable, statistical character of a data generation mechanism. Accordingly, a relationship between the "histogram calculation device" and the "degree of outlier calculation device" is completely the same as that between the above-described "probability density estimation device" and "degree of outlier calculation device". More specifically, the "histogram calculation device" expresses statistical calculation of the data generation mechanism based on which the "degree of outlier calculation device" calculates how much input data deviates from character of the data generation mechanism as a "degree of outlier".

Figure 11:
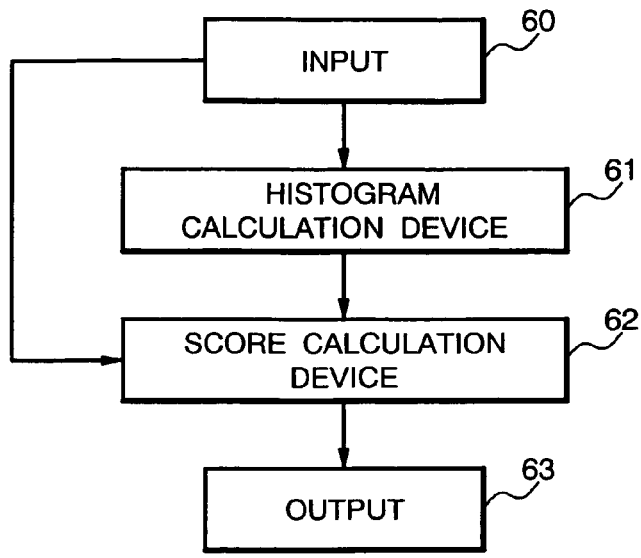
FIG. 11 is a diagram showing a structure of an example of a degree of outlier calculation device using the device of FIG. 10.
Figure 12:
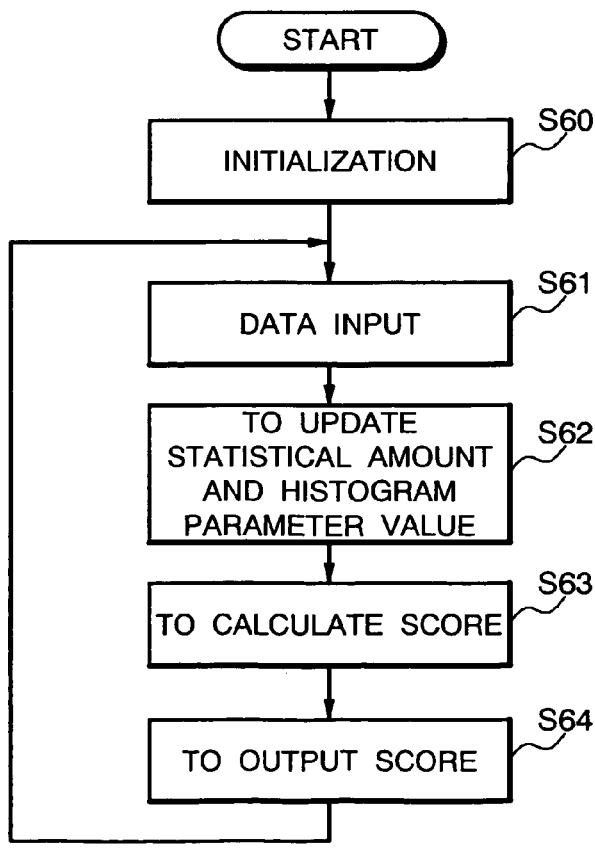
FIG. 12 is a flow chart of operation of the device illustrated in FIG. 11.

FIG. 11 shows an entire structure of a degree of outlier calculation device using the histogram calculation device illustrated in FIG. 9, and FIG. 12 shows a flow chart of the operation of the device. Discrete value data from an input unit 60 is sequentially input to a histogram calculation device 61 and a score calculation device 62 (Step S61). The score calculation device 62 is connected to the histogram calculation device 61 which outputs a parameter value of the histogram from the input data (Step S62) and sends the same to the score calculation device 62. With the input data and the output of the histogram calculation device 61 as inputs, the score calculation device 62 calculates a score of a degree of outlier of the input data (Step S63).

As a score calculation method in this case, as well as in a case of continuous value data, a square distance, a Hellinger distance, a logarithmic loss, etc. can be used. In the histogram, a probability value $p^{(t)}(x)$ of data x to be stored in a j-th cell at a time t is calculated as follows:

$$p^{(t)}(x) = p^{(t)}(j)/L_j$$

In the expression, $L_j$ denotes a number of points to be stored in the j-th cell and $p^{(t)}(j)$ denotes a probability value of the j-th cell at the time t. Using the equation, the square distance $ds(p^{(t)}, p^{(t-1)})$ and the Hellinger distance $dh(p^{(t)}, p^{(t-1)})$ are calculated according to the following expressions, respectively:

$$d_s(p^{(t)}, p^{(t-1)}) \stackrel{def}{=} \sum_x (p^{(t)}(x) - p^{(t-1)}(x))^2,$$

$$d_h(p^{(t)}, p^{(t-1)}) \stackrel{def}{=} \sum_x \left(\sqrt{p^{(t)}(x)} - \sqrt{p^{(t-1)}(x)}\right)^2$$

For the score calculation device 62 to conduct these calculations, the degree of outlier calculation device should be set to receive parameter values of $p^{(t)}$ and $p^{(t-1)}$ from the histogram calculation device 61. In addition, a logarithmic loss for input data $x_t$ at a time t is calculated by the following expression:

$$-\log p^{(t-1)}(x_t)$$

The foregoing scores mean a change of an estimated distribution measured as a statistical distance or a logarithmic loss for an estimated distribution of input data and either case their statistical significance is unclear.

Figure 13:
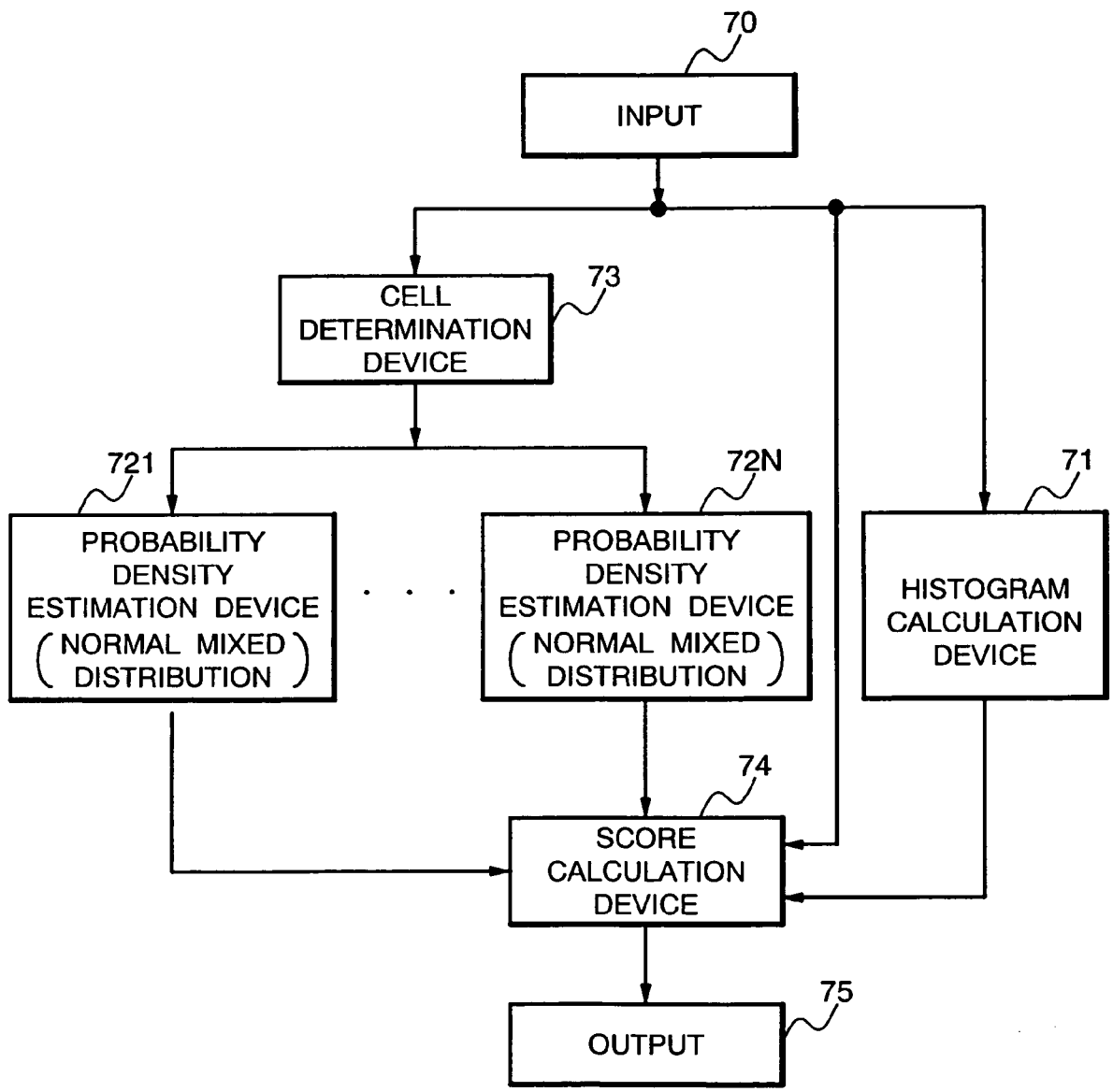
FIG. 13 is a diagram showing a structure of an example of a degree of outlier calculation device using the devices of FIGS. 1 and 9.
Figure 14:
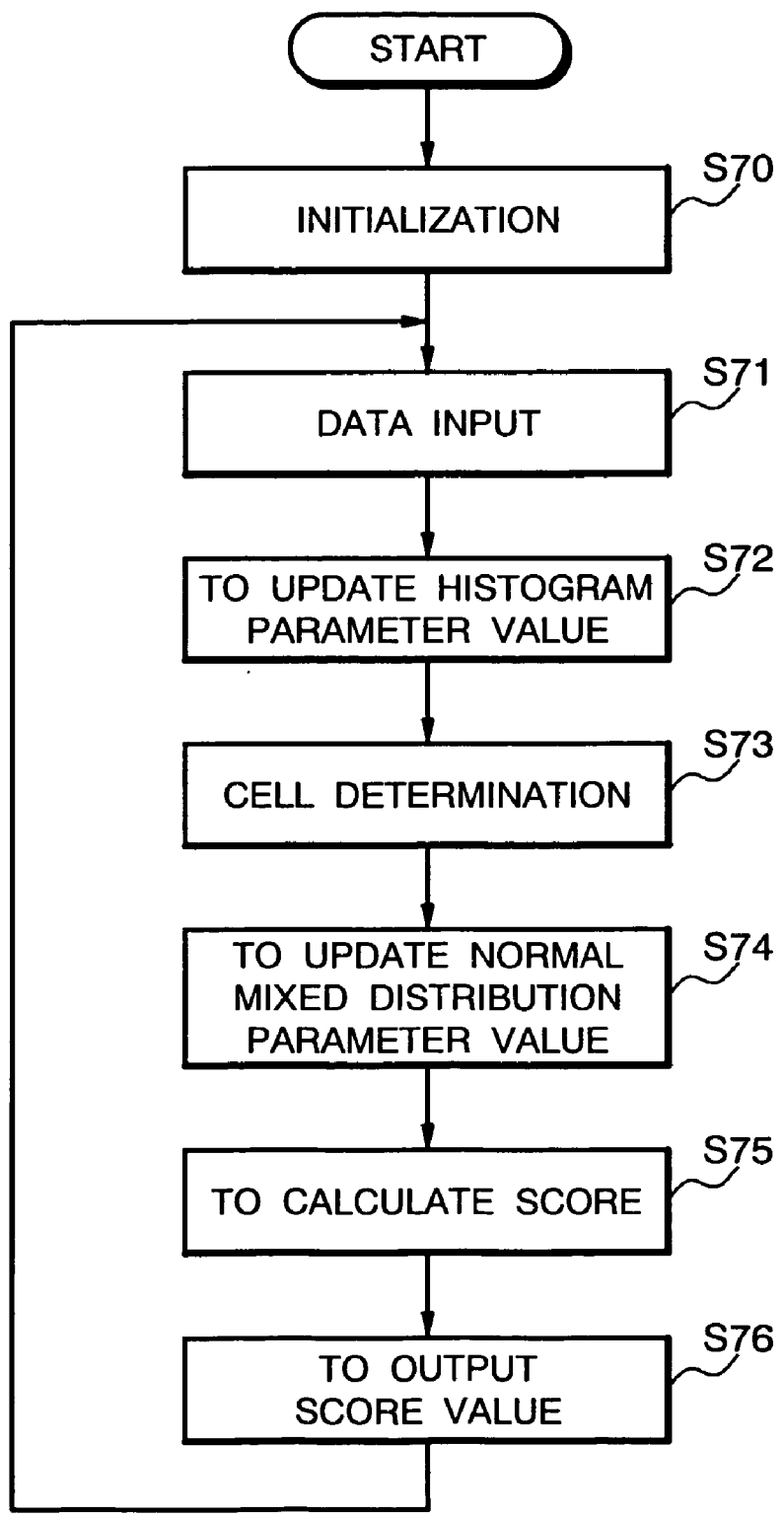
FIG. 14 is a flow chart of operation of the device illustrated in FIG. 13.

FIG. 13 is a diagram showing an entire structure of a degree of outlier calculation device according to a further embodiment of the present invention which employs the normal mixture density estimation device illustrated in FIG. 1 and the histogram calculation device illustrated in FIG. 9, while FIG. 14 is a flow chart showing operation thereof. Input data described both in a discrete value and a continuous value is sequentially input to a histogram calculation device 71, a cell determination device 73 and a score calculation device 74 (Step S71). Connected to the cell determination device 73 are a number N of probability density calculation devices 721 to 72N for a normal mixture. Here, N denotes the number of cells in the histogram of the histogram calculation device 71. To all the probability density calculation devices 721 to 72N and the histogram calculation device 71, the score calculation device 74 is connected.

The histogram calculation device 71 calculates a parameter of the histogram only from a discrete data part of the input data (Step S72) and sends the same to the score calculation device 74. The cell determination device 73 determines to which cell of the histogram the discrete data part of the input data belongs (Step S73) and to the corresponding probability density estimation device, sends a continuous data part.

The probability density calculation devices 721 to 72N calculate a parameter of the probability density only when receiving the input data sent in (Step S74) and sends the parameter to the score calculation device 74. The score calculation device 74 calculates a score of the original input data with the input data, the output from the histogram calculation device 71 and any one of the outputs from the probability density calculation devices 721 to 72N as inputs (Step S75) and takes the score as an output (Step S76).

The score calculation device 74 calculates a score, for example, as a degree of a change in a probability distribution measured by a Hellinger distance or as a negative logarithmic likelihood (logarithmic loss) of a probability distribution with respect to input data. Denote a vector made up of categorical variables as x and a vector made up of continuous variables as y. A simultaneous distribution of x and y will be expressed as follows:

$$p(x,y)=p(x)p(y|x)$$

In the expression, p(x) represents a probability distribution of x which is expressed by a histogram density. p(y|x) represents a conditional probability distribution of y with x being applied. This is provided for each divisional region. With respect to new input data $Dt=(x_t, y_t)$, a Hellinger distance is calculated in the following manner.

$$d_h(p^{(t)}, p^{(t-1)}) = 2 - 2\sum_x \sqrt{p^{(t)}(x)p^{(t-1)}(x)} \int \sqrt{p^{(t)}(y|x)p^{(t-1)}(y|x)}\, dy$$

These are immediately generalized into a distance between $p^{(t)}$ and $p^{(t-T)}$, with T as a positive integer.

In addition, a logarithmic loss is calculated according to the following expression:

$$-\log p^{(t-1)}(x_t) - \log p^{(t-1)}(y_t|x_t)$$

Figure 15:
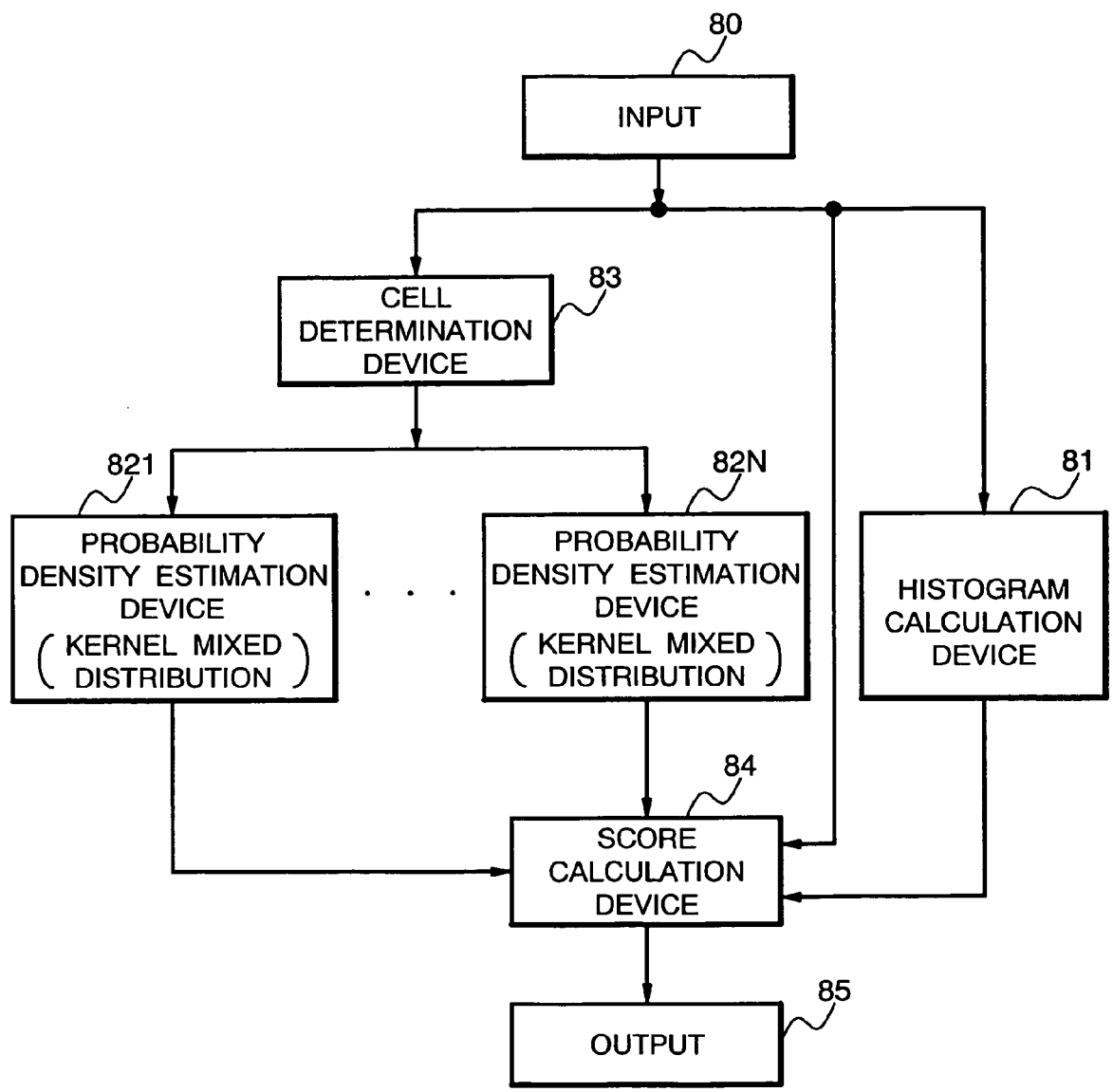
FIG. 15 is a diagram showing a structure of an example of a degree of outlier calculation device using the devices of FIGS. 5 and 9.
Figure 16:
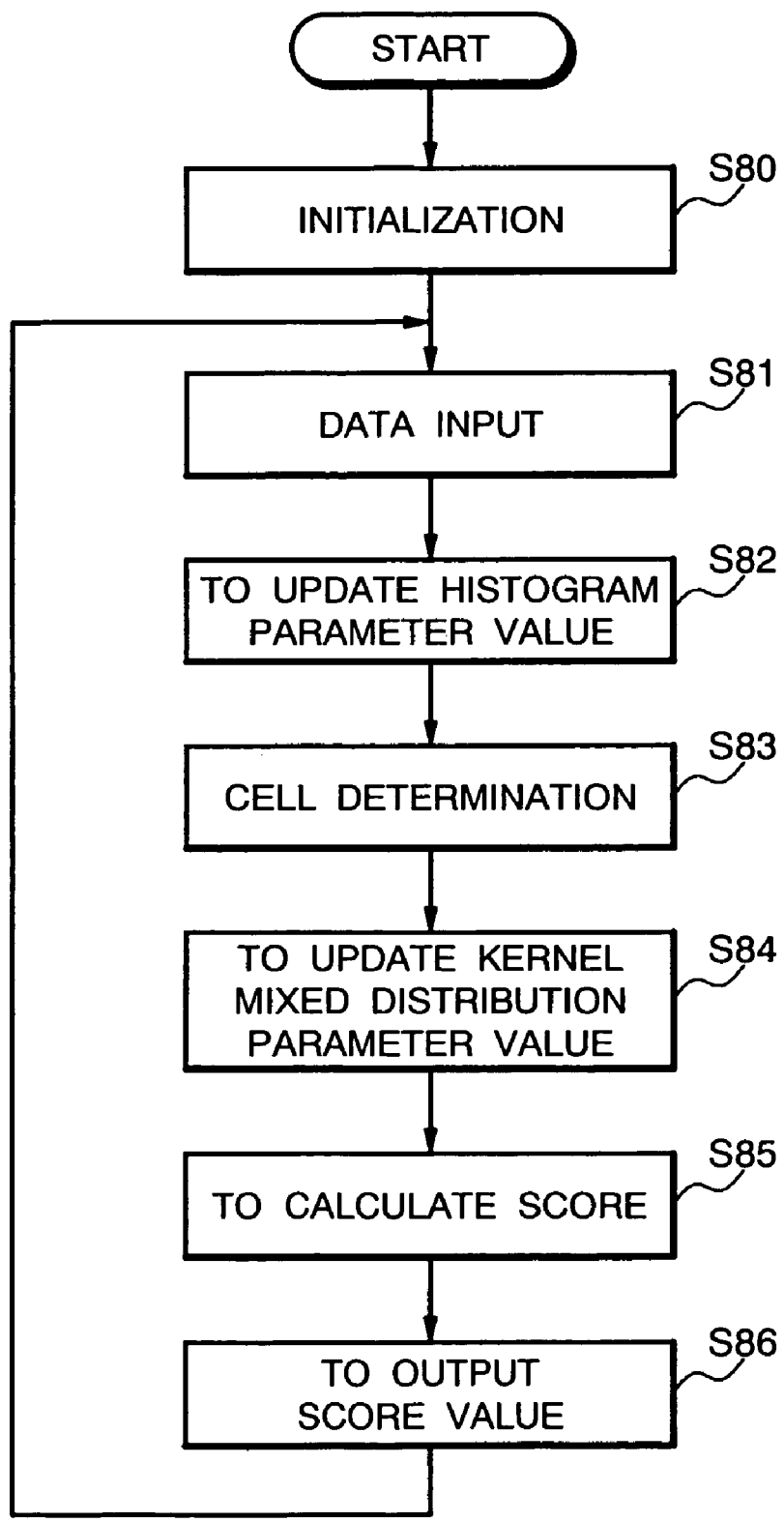
FIG. 16 is a flow chart of operation of the device illustrated in FIG. 15.

FIG. 15 is a diagram showing an entire structure of a degree of outlier calculation device according to the present invention which employs the kernel mixture distribution probability density estimation device illustrated in FIG. 5 and the histogram calculation device illustrated in FIG. 9, while FIG. 16 is a flow chart showing operation thereof. Input data described both in a discrete value and a continuous value the stored parameter values is sequentially input to a histogram calculation device 81, a cell determination device 83 and a score calculation device 84 (Step S81). To the cell determination device 83, a number N of probability density calculation devices 821 to 82N for a kernel mixture distribution are connected. Here, N denotes the number of cells in the histogram of the histogram calculation device 81.

To all the probability density calculation devices 821 to 82N and the histogram calculation device 81, the score calculation device 84 is connected. The histogram calculation device 81 calculates a parameter of the histogram only from a discrete data part of the input data (Step S82) and sends the same to the score calculation device 84. The cell determination device 83 determines to which cell of the histogram the discrete data part of the input data belongs (Step S83) and to the corresponding probability density estimation device, sends a continuous data part. The probability density calculation devices 821 to 82N calculate a parameter of the probability density only when receiving the input data sent in (Step S84) and sends the parameter to the score calculation device 84 (Step S85).

The score calculation device 84 calculates a score of the original input data with the input data, the output from the histogram calculation device 81 and any one of the outputs from the probability density calculation devices 821 to 82N as inputs and takes the score as an output (Step S86). The score calculation method is the same as that of the degree of outlier calculation device shown in FIG. 13.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A probability density estimation device for an anomalous data detection system adapted to detect anomalous data, said probability density estimation device configured for a degree of outlier calculation device for sequentially calculating a degree of outlier of each data with a data sequence of real vector values as input, said probability density estimation device for, while sequentially reading said data sequence, estimating a probability distribution of generation of the data by using a finite mixture distribution of normal distributions with a weighting parameter, a mean parameter and a variance parameter, said probability density estimation device comprising:

probability calculation means for calculating, based on a value of input data and values of a mean parameter and a variance parameter of each of a finite number of normal distribution densities, a probability of generation of the input data from each normal distribution; and parameter output means for updating and rewriting the stored parameter values while gradually forgetting past data, according to newly read data based on a probability obtained by the probability calculation means, values of a mean parameter and a variance parameter of each normal distribution and a weighting parameter of each normal distribution, and anomalous data, indicative of fraud, being identified when said probability of generation of the input data deviates from said stored parameter values.

2. The probability density estimation device as set forth in claim 1, further comprising: parameter storage means for storing values of a mean parameter and a variance parameter of each of a finite number of normal distribution densities and a weighting parameter of each normal distribution, wherein said parameter rewriting means updates and rewrites data of said parameter storage means.

3. A degree of outlier calculation device for sequentially calculating a degree of outlier of each data with a data sequence of real vector values as input, said degree of outlier calculation device adapted to detect anomalous data, and comprising:

a probability density estimation device for, while sequentially reading said data sequence, estimating a probability distribution of generation of the data by using a finite mixture of normal distributions with a weighting parameter, a mean parameter and a variance parameter, said probability density estimation device including:
(a) parameter storage means for storing values of a mean parameter and a variance parameter of each of a finite number of normal distribution densities and a weighting parameter of each normal distribution;
(b) probability calculation means for calculating, based on a value of input data and values of a mean parameter and a variance parameter of each of a finite number of normal distribution densities, a probability of generation of the input data from each normal distribution; and
(c) parameter rewriting means for updating and rewriting the stored parameter values while gradually forgetting past data, according to newly read data based on a probability obtained by the probability calculation means, values of a mean parameter and a variance parameter of each normal distribution and a weighting parameter of each normal distribution; and degree of outlier calculation means for calculating and outputting a degree of outlier of said data by using a parameter of the normal mixture updated by said probability density estimation device and based on a degree of change or a logarithmic loss of a probability distribution estimated from values of the parameters before and after the updating and the input data, and anomalous data, indicative of fraud, being identified when said degree of outlier data deviates from said stored parameter values.

4. A histogram calculation device for a degree of outlier calculation device for sequentially calculating a degree of outlier of each data with discrete value data as input, said degree of outlier calculation device useful for anomalous data detection, histogram calculation device for calculating a parameter of a histogram with respect to said discrete value data sequentially input, said histogram calculation device comprising:

storage means for storing a parameter value of said histogram; and parameter updating means for reading said parameter value from the storage means and updating past parameter values while gradually forgetting past data based on input data to rewrite the value of said storage means, thereby outputting some of parameter values of said storage means, and anomalous data, indicative of fraud, being identified when said degree of outlier deviates from said stored parameter values.

5. A degree of outlier calculation device for sequentially calculating a degree of outlier of each data with discrete value data as input, said degree of outlier calculation device useful for anomalous data detection, and comprising:

a histogram calculation device for calculating a parameter of a histogram with respect to said discrete value data sequentially input, said histogram calculation device including:

storage means for storing a parameter value of said histogram; and parameter updating means for reading said parameter value from the storage means and updating past parameter values while gradually forgetting past data based on input data to rewrite the value of said storage means, thereby outputting some of parameter values of said storage means; and score calculation means for calculating, based on the output of the histogram calculation device and said input data, a score of the input data with respect to said histogram, thereby outputting the output of the score calculation means as a degree of outlier of said input data, and anomalous data, indicative of fraud, being identified when said degree of outlier deviates from said stored parameter values.

6. A degree of outlier calculation device for calculating a degree of outlier with respect to sequentially input data which is described both in a discrete value and a continuous value, said degree of outlier calculation device useful for anomalous data detection, and comprising:

a histogram calculation device for estimating a histogram with respect to a discrete value data part;

a number of probability density estimation devices, the number equal to the number of cells of said histogram, the probability density estimation devices for estimating a probability density with respect to a continuous value data part;

cell determination means for determining to which cell of said histogram said discrete value data part belongs to send the continuous data part to the corresponding one of said probability density estimation devices; and score calculation means for calculating a score of said input data based on a degree of change or logarithmic loss of a probability distribution estimated from output values of said histogram calculation device and said probability density estimation device and said input data, thereby outputting the output of the score calculation means as a degree of outlier of said input data;

said histogram calculation device including:

storage means for storing a parameter value of said histogram; and parameter updating means for reading said parameter value from the storage means and updating past parameter values while gradually forgetting past data based on input data to rewrite the value of said storage means, thereby outputting some of parameter values of said storage means; and said probability density estimation device including:

parameter storage means for storing values of a mean parameter and a variance parameter of each of a finite number of normal distribution densities and a weighting parameter of each normal distribution;

probability calculation means for calculating, based on a value of input data, and values of a mean parameter and a variance parameter of each of a finite number of normal distribution densities, a probability of generation of the input data from each normal distribution; and parameter rewriting means for updating and rewriting the stored parameter values while gradually forgetting past data, according to newly read data based on a probability obtained by the probability calculation means, values of a mean parameter and a variance parameter of each normal distribution and a weighting parameter of each normal distribution, and anomalous data, indicative of fraud, being identified when said degree of outlier deviates from said stored parameter values.

7. A degree of outlier calculation device for calculating a degree of outlier with respect to sequentially input data which is described both in a discrete value and a continuous value, said degree of outlier calculation device useful for anomalous data detection, and comprising:

a histogram calculation device for estimating a histogram with respect to said discrete value data part;

a number of probability density estimation devices, the number equal to the number of cells of said histogram for estimating a probability density with respect to a continuous value data part;

cell determination means for determining to which cell of the histogram said discrete value data part belongs to send the continuous data part to the corresponding one of said probability density estimation devices; and score calculation means for calculating a score of said input data based on a degree of change or logarithmic loss of a probability distribution estimated from output values of said histogram calculation device and said probability density estimation device and said input data, thereby outputting the output of the score calculation means as a degree of outlier of said input data;

said histogram calculation device including:

storage means for storing a parameter value of said histogram; and parameter updating means for reading said parameter value from the storage means and updating past parameter values while Gradually forgetting past data based on input data to rewrite the value of said storage means, thereby outputting some of parameter values of said storage means; and said probability density estimation device including:

parameter storage means for storing a value of a parameter indicative of a position of each kernel; and parameter rewriting means for reading a value of a parameter from the storage means and updating the stored parameter values while gradually forgetting past data, according to newly read data to rewrite the contents of the parameter storage means, and anomalous data, indicative of fraud, being identified when said degree of outlier deviates from said stored parameter values.

8. A probability density estimation method for a degree of outlier calculation device of a data processor for sequentially calculating a degree of outlier of each data with a data sequence of real vector values as input, said degree of outlier calculation device useful for anomalous data detection, said probability density estimation method of, while sequentially reading said data sequence, estimating a probability distribution of generation of the data by using a finite mixture of normal distributions with a weighting parameter, a mean parameter and a variance parameter, the method comprising:

based on values of a mean parameter and a variance parameter of each of a finite number of normal distribution densities read from parameter storage means for storing a value of input data, values of a mean parameter and a variance parameter of each of a finite number of normal distribution densities, and a weighting parameter of each normal distribution, calculating a probability of generation of the input data from each normal distribution; and updating the stored parameter values while gradually forgetting past data, according to newly read data based on a probability obtained by the probability calculation means, values of a mean parameter and a variance parameter of each normal distribution and a weighting parameter of each normal distribution to rewrite data of said parameter storage means, and anomalous data, indicative of fraud, being identified when said probability of generation of the input data deviates from said stored parameter values.

9. A computer-readable medium incorporating a program of instructions executable by a computer for performing a method of sequentially calculating a degree of outlier of each data for anomalous data detection, with a data sequence of real vector values as input, including a probability density estimation for, while sequentially reading said data sequence, estimating a probability distribution of generation of the data by using a finite mixture of normal distributions with a weighting parameter, a mean parameter and a variance parameter, the probability density estimation comprising:

based on values of a mean parameter and a variance parameter of each of a finite number of normal distribution densities read from parameter storage means for storing a value of input data, values of a mean parameter and a variance parameter of each of a finite number of normal distribution densities, and a weighting parameter of each normal distribution, calculating a probability of generation of the input data from each normal distribution; and updating the stored parameter values while gradually forgetting past data, according to newly read data based on a probability obtained by the probability calculation means, values of a mean parameter and a variance parameter of each normal distribution and a weighting parameter of each normal distribution to rewrite data of said parameter storage means; said method of sequentially calculating a degree of outlier of each data further comprising:

calculating and outputting a degree of outlier of said data by using a parameter of the finite mixture distribution updated by said probability density estimation and based on a probability distribution estimated from values of the parameters before and after the updating and the input data, and anomalous data, indicative of fraud, being identified when said degree of outlier deviates from said stored parameter values.

10. A computer-readable medium incorporating a program of instructions executable by a computer for performing a histogram calculation method for calculation of a degree of outlier for sequentially calculating a degree of outlier of each data with discrete value data as input, said calculation of the degree of outlier for detecting anomalous data, said histogram calculation method calculating a parameter of a histogram with respect to said discrete value data sequentially input, comprising:

reading said parameter value from storage means for storing a parameter value of said histogram and updating past parameter values while gradually forgetting past data based on input data to rewrite the value of said storage means; and outputting some of parameter values of said storage means, and anomalous data, indicative of fraud, being identified when said degree of outlier deviates from said stored parameter values.

11. A degree of outlier calculation device of a data processor for sequentially calculating a degree of outlier of each data with discrete value data as input, said degree of outlier calculation device useful for detecting anomalous data, and said degree of outlier calculation device comprising:

a histogram calculation device for calculating a parameter of a histogram with respect to said discrete value data sequentially input, including:

storage means for storing a parameter value of said histogram; and parameter updating means for reading said parameter value from the storage means and updating past parameter values while gradually forgetting past data based on input data to rewrite the value of said storage means, thereby outputting some of parameter values of said storage means; and score calculation means for calculating, based on the output of the histogram calculation device and said input data, a score of the input data with respect to said histogram, thereby outputting the score calculation result as a degree of outlier of said input data, and anomalous data, indicative of fraud, being identified when said degree of outlier deviates from said stored parameter values.

12. A degree of outlier calculation method of calculating a degree of outlier by a data processor with respect to sequentially input data which is described both in a discrete value and a continuous value, calculation of the degree of outlier useful for detection of anomalous data, wherein a histogram calculation estimates a histogram with respect to a discrete value data part, said method comprising:

reading said parameter value from storage means for storing a parameter value of said histogram and updating past parameter values while gradually forgetting past data based on input data to rewrite the value of said storage means; and outputting some of parameter values of said storage means, and wherein probability density estimation devices provided as many as the number of cells of said histogram for estimating a probability density with respect to a continuous value data part, said method comprises the steps of:

based on values of a mean parameter and a variance parameter of each of a finite number of normal distribution densities read from parameter storage means for storing a value of input data, values of a mean parameter and variance parameter of each of a finite number of normal distribution densities and a weighting parameter of each normal distribution, calculating a probability of generation of the input data from each normal distribution;

based on a probability obtained by the probability calculation means, values of a mean parameter and a variance parameter of each normal distribution and a weighting parameter of each normal distribution, updating the stored parameter values while gradually forgetting past data, according to newly read data to rewrite the data of said parameter storage means;

determining to which cell of said histogram said discrete value data part belongs to send the continuous data part to the corresponding one of said probability density estimation devices;

calculating a score of said input data based on a degree of change or logarithmic loss of a probability distribution estimated from output values of said histogram calculation device and said probability density estimation device and said input data; and outputting the score calculation result as a degree of outlier of said input data, and anomalous data, indicative of fraud, being identified when said degree of outlier deviates from said stored parameter values.

* * * * *